US011340258B2

(12) United States Patent
Stanford et al.

(10) Patent No.: US 11,340,258 B2
(45) Date of Patent: May 24, 2022

(54) PROBE PINS WITH ETCHED TIPS FOR ELECTRICAL DIE TEST

(71) Applicant: INTEL CORPORATION, Santa Clara, CA (US)

(72) Inventors: Joseph D. Stanford, Portland, OR (US); David Craig, Hillsboro, OR (US); Todd P. Albertson, Warren, OR (US); Mohit Mamodia, Chandler, AZ (US); Dingying Xu, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/817,480

(22) Filed: Mar. 12, 2020

(65) Prior Publication Data

US 2020/0209280 A1 Jul. 2, 2020

Related U.S. Application Data

(63) Continuation of application No. 15/083,082, filed on Mar. 28, 2016, now Pat. No. 10,598,696.

(51) Int. Cl.
G01R 1/067 (2006.01)
G01R 1/073 (2006.01)
G01R 3/00 (2006.01)

(52) U.S. Cl.
CPC ..... *G01R 1/07307* (2013.01); *G01R 1/06761* (2013.01); *G01R 3/00* (2013.01)

(58) Field of Classification Search
CPC ........ G01R 1/067; G01R 31/20; G01R 31/02; G01R 1/073; G01R 31/28; G01R 1/07307; G01R 3/00; H01R 43/16; B23P 19/00

(Continued)

(56) References Cited

U.S. PATENT DOCUMENTS 6,573,738 B1 6/2003 Matsuo et al.
2008/0143366 A1 6/2008 Kurotori et al.
(Continued)

FOREIGN PATENT DOCUMENTS

JP H08262249 A * 10/1996 ............... G02B 6/13

OTHER PUBLICATIONS

Espacnet Translate JPH08262249A Forming Method of Optical Waveguide Element (Year: 1996).*
(Continued)

*Primary Examiner* — Jermele M Hollington
*Assistant Examiner* — Courtney G McDonnough
(74) *Attorney, Agent, or Firm* — Essential Patents Group, LLP.

(57) ABSTRACT

A prober head to interface an E-testing apparatus to a device under test, which may be an unpackaged die, for example. In some embodiments, the prober head includes an array of conductive pins, each of the pins extending outwardly from a first pin end anchored to a substrate. At least a partial length of each of the pins is coated with a hydrophobic monolayer. The conductive pins may be composite metal wires including a core metal encased by one or more peripheral metal. At a tip of the pins, opposite the first pin end anchored to the substrate, the peripheral metals are recessed from the core metal. In further embodiments, the hydrophobic monolayer is disposed on an outer surface of the peripheral metals, but is substantially absent from a surface of the core metal exposed at the tip.

18 Claims, 5 Drawing Sheets

(58) Field of Classification Search
USPC .................................................. 324/754.11
See application file for complete search history.

(56) References Cited

U.S. PATENT DOCUMENTS

| | | | | |
|---|---|---|---|---|
| 2009/0174423 | A1* | 7/2009 | Klaerner | G01R 1/07357 |
| | | | | 324/754.07 |
| 2010/0231249 | A1 | 9/2010 | Dang et al. | |
| 2011/0067231 | A1 | 3/2011 | Kim | |
| 2011/0128025 | A1 | 6/2011 | Kazama et al. | |
| 2012/0146679 | A1* | 6/2012 | Chang | G01R 1/07378 |
| | | | | 324/756.03 |
| 2015/0002181 | A1* | 1/2015 | Martin | G01R 3/00 |
| | | | | 324/756.03 |
| 2015/0015287 | A1* | 1/2015 | DeBauche | G01R 3/00 |
| | | | | 324/750.25 |
| 2016/0274148 | A1* | 9/2016 | Stevenson | G01R 31/26 |

OTHER PUBLICATIONS

International Preliminary Report on Patentability for International Patent Application No. PCT/US17/18733, dated Oct. 11, 2018.
International Search Report and Written Opinion for International Patent Application No. PCT/US2017/018733, dated Jun. 26, 2017.
Notice of Allowance for U.S. Appl. No. 15/083,082, dated Nov. 29, 2019.
Office Action for U.S. Appl. No. 15/083,082, dated May 22, 2019.

* cited by examiner

PROBE PINS WITH ETCHED TIPS FOR ELECTRICAL DIE TEST

CLAIM FOR PRIORITY

This application is a continuation of prior U.S. patent application Ser. No. 15/083,082, filed on Mar. 28, 2016 and titled "PROBE PINS WITH ETCHED TIPS FOR ELECTRICAL DIE TEST", which is incorporated by reference in its entirety.

BACKGROUND

In the integrated circuit (IC) industry, devices fabricated in parallel on a large substrate, such as a 300 mm or 450 mm wafer, are typically sorted based on an electrical test (E-test) at the back end of line (BEOL). The devices are singulated into chips following a backside wafer grind. Singulated die identified good at the BEOL E-test are then assembled into a package. A final functional test of the packaged die is then performed. As post-singulation die processing and package assembly practices become more complex, it becomes more important to perform one or more E-test on unpackaged die, for example to filter out die that passed BEOL E-test but have since become unsuitable for packaging.

E-testing, particularly of unpackaged die, is a significant challenge because of the small dimensions, and vast number of testable points (e.g. top-level metallization) on modern ICs. For example, a microprocessor die may have thousands of testable points. E-testing of a packaged die is comparatively easier than testing of unpackaged die as the package assembly breaks out the top-level die metallization (e.g., having a pitch of 100 µm, or less) to packaged electrical connections of larger dimensions. To perform a comprehensive E-test on an unpackaged die, a prober head of an electrical testing apparatus (E-tester) may be coupled to a die through a space transforming prober interface. During testing, the space transformer repetitively interfaces with consecutive unpackaged die under test (DUT). Top-level interconnect geometries (e.g., having a pitch of 100 µm, or less) are to be accommodated as they are scaled, so electrical probe pin dimensions and alignment are critical to ensure accurate testing without damaging the DUT.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
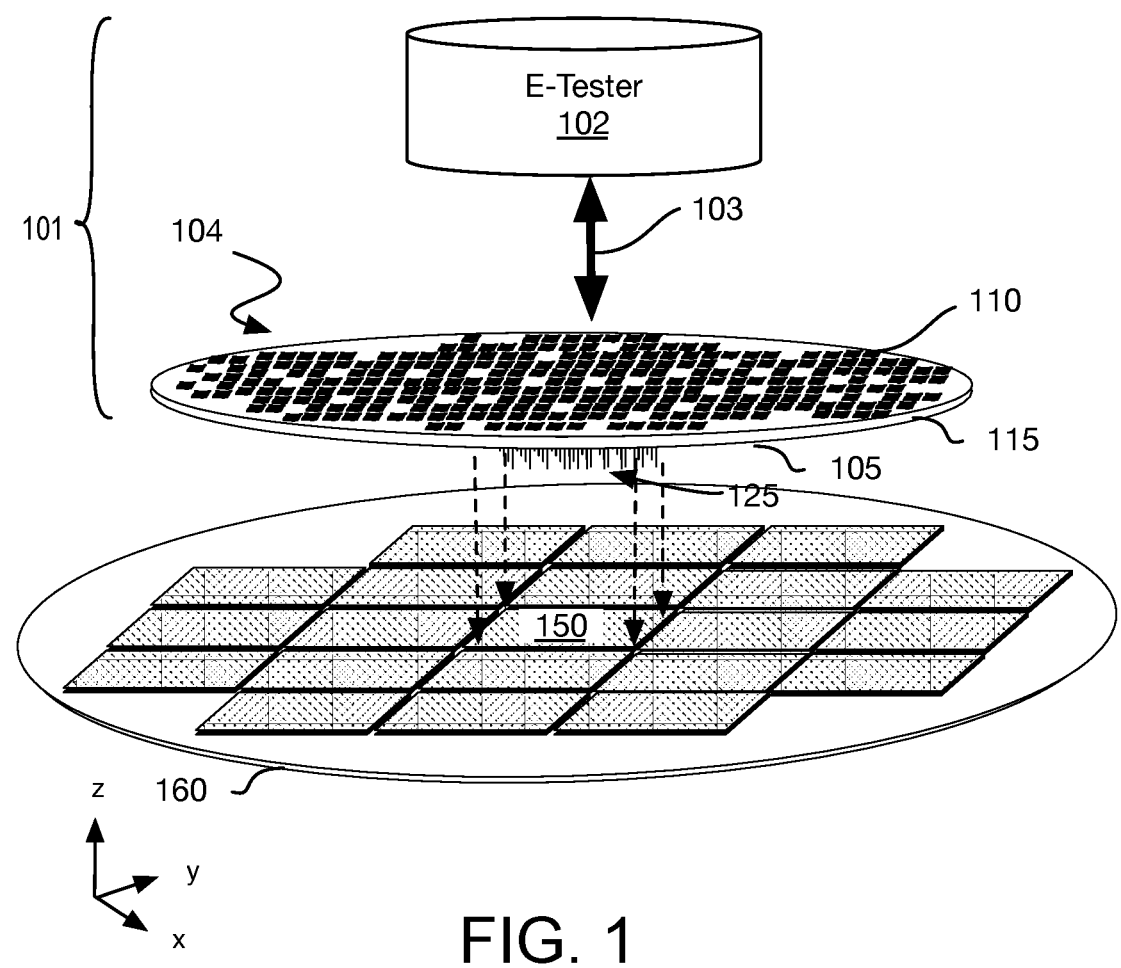
FIG. 1 is an isometric view of an electrical testing apparatus for unpackaged die, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present embodiments may be practiced without these specific details. In some instances, well-known methods and devices are shown in block diagram form, rather than in detail, to avoid obscuring features of the exemplary embodiments. Reference throughout this specification to "an embodiment" or "one embodiment" means that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the exemplary embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are exemplary embodiments of a prober head to interface an E-testing apparatus to a device under test, which may be an unpackaged die, for example. In some embodiments, the prober head includes an array of conductive pins, each of the pins extending outwardly from a first pin end anchored to a substrate. The pins are electrically coupled to at least one of the conductive traces on the substrate as a prober interface between an E-testing apparatus and a DUT. The conductive pins may be composite metal wires including a core metal encased by one or more peripheral metal. In some embodiments, at least a partial length of each of the pins is coated with a hydrophobic monolayer. In some embodiments, at a tip of the pins, opposite the first pin end anchored to the substrate, the one or more peripheral metals are recessed from the core metal. In further embodiments, the hydrophobic monolayer is disposed on an outer surface of the peripheral metals, but is substantially absent from a surface of the core metal exposed at the tip.

Also as described further herein, a method of conditioning tips of an electrical-test probe pin array may include coating an exterior metallic surface of pins of the array with a hydrophobic monolayer. The method may include contacting a tip end of the pins to a surface of a porous solid medium. The method may include placing the tip end of the pins in fluid communication with a liquid etchant by exposing the porous solid medium to the etchant while the pins are contacting the medium. The method may further include removing the pins from contact with the medium after the etchant has etched a portion of the pins.

FIG. 1 is an isometric view of an electrical testing apparatus 101 for an unpackaged DUT 150, in accordance with some embodiments. Apparatus 101 includes an electrical tester (E-tester) 102 electrically coupled to a prober head that includes a space transformer 104. In some embodiments, E-tester 102 is commercially available automated test equipment (ATE) configured for functional, performance, and/or stress testing of an IC. Electrical coupling 103 between E-tester 102 and space transformer 104 may be any known prober Interface Test Adapter (ITA). Space transformer 104 further provides electronic connections between electrical coupling 103 and unpackaged DUT 150. In the illustrated embodiment, space transformer 104 includes a substrate 115, and electrical coupling 103 makes electrical connections to metallization 110 disposed on a first side of substrate 115. Substrate 115 further includes conductive trace routing electrically coupling metallization 110 to a probe pin array 125 extending from a second side of substrate 115. Substrate 115 may further include additional circuitry to adapt signals between the E-tester 102 and unpackaged DUT 150. In some exemplary embodiments, substrate 115 is an organic polymer, which may advantageously facilitate fabrication of probe pin array 125.

Unpackaged DUT 150 is disposed on a carrier 160. In some embodiments, DUT 150 is a thinned die that has been singulated, for example by a laser scribing operation. Carrier 160 may be a membrane, such as a backside tape applied after a backside grind operation. During an electrical die testing operation, test points on DUT 150 are to be aligned with probe pin array 125 and brought into electrical contact with probe pin array 125, for example by an ATE handler. In some embodiments, conductive features in a top-level of metallization on DUT 150 (e.g., surface-finished pads) are brought into contact with probe pin array 125 and an electrical test algorithm is executed on the DUT through the array of conductive probe pins. As such, space transformer 104 may supplant the role of a DUT socket typically employed to bridge the connection between a prober ITA and a packaged DUT.

Figure 2:
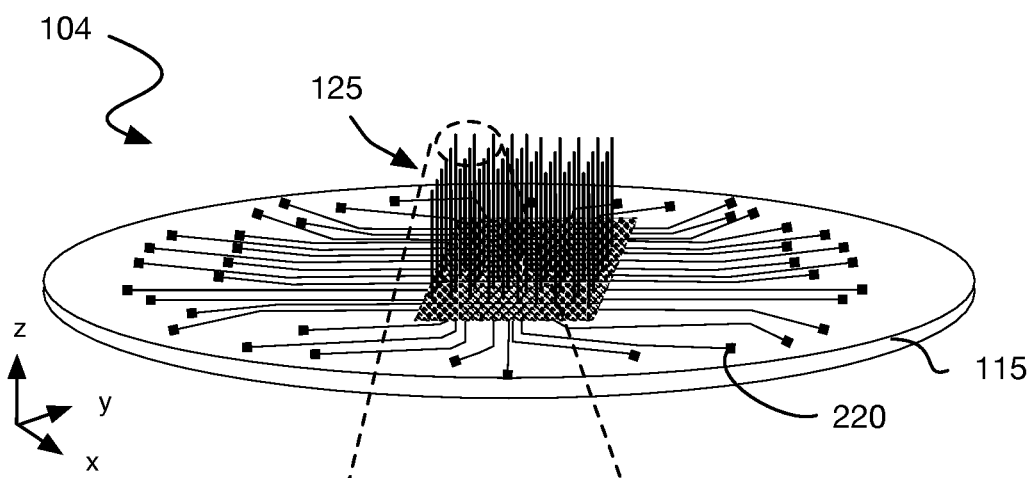
FIG. 2 is an isometric view of a prober head assembly for electrical die test, in accordance with some embodiments.
Figure 3:
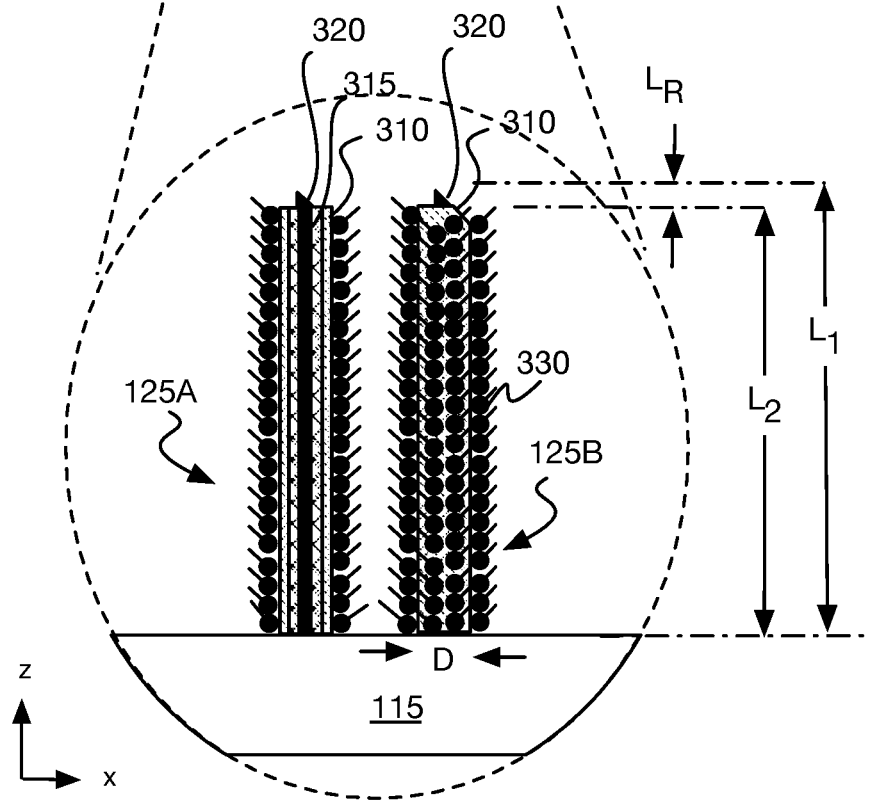
FIG. 3 is an expanded 2D side view and longitudinal sectional view of probe pins of a pin array included in the prober head assembly illustrated in FIG. 2, in accordance with some embodiments.

FIG. 2 is an isometric view of space transformer 104, in accordance with some embodiments. FIG. 3 is an expanded 2D side view of probe pins of the probe pin array illustrated in FIG. 2, in accordance with some further embodiments. In FIG. 2, space transformer 104 is inverted from the configuration illustrated in FIG. 1 to further illustrate probe pin array 125. Substrate 115 further includes a plurality of conductive traces 220 that break out from the dense probe pin array 125, for example with a single trace electrically coupled to an anchored end of one pin of probe pin array 125. After breakout, traces 220 may pass vertically through substrate 115 to metallization 110 (FIG. 1). Probe pin array 125 may be dimensioned to accommodate any number of probe pins as a function of test points available on the DUT. In some microprocessor embodiments, for example, probe pin array 125 may extend over an area of 1 cm$^2$, or more. In some further embodiments, probe pin array 125 extends at least 50 mm in at least one dimension of the array (e.g., x-dimension).

Individual probe pin dimensions may vary, but in some exemplary embodiments a single probe pin has a diameter D (FIG. 3) below 50 µm, and advantageously below 40 µm. Probe pins of such diameter may extend outwardly from substrate 115 by a longitudinal length $L_1$ (FIG. 3) of about 300 µm, or more. Probe pin pitch may vary, both between different probe arrays, and within a single array. In some embodiments where probe pin diameter is below 50 µm, pitch may be 120 µm, or less, in some regions of the array.

In some embodiments, conductive pins of a probe pin array include a metallic external surface, and a hydrophobic material is disposed on this metallic external surface. The hydrophobic material may advantageously reduce capillary forces associated with the probe pin array. The hydrophobic material may be selected based upon the composition of the metallic probe pin surface to which it is applied. In some advantageously embodiments, at least a partial longitudinal length of each of the pins is coated with a monolayer of the hydrophobic material. As shown in FIG. 3, for probe pins 125A, 125B having a longitudinal length $L_1$, hydrophobic monolayer 330 extends over a longitudinal length $L_2$, which is smaller than $L_1$ by a longitudinal recess length $L_R$. Longitudinal recess length $L_R$ may vary, but in some exemplary embodiments is 50 µm, or more. Hydrophobic monolayer 330 may self-assemble as a monolayer on an external surface of outer metal 310 and increase the contact angle of aqueous fluids, or hydrophilic fluids, to which the probe pins may be exposed, for example during conditioning of a tip portion of the pins.

Hydrophobic monolayer 330 is advantageously one molecule in thickness with the molecule including a terminal functional group coupled to a "reactive head," or ligand that has an affinity for outer metal 310. Tails of the monolayer molecule may be synthesized to have any desired functionality, such as, or in addition to, hydrophobicity, and may therefore include any known alkane, alkene, or aromatic structure. Such monolayers may be a self-assembled adsorbates, enabling the coating to be formed simply by submerging the probe pin array in a solution of the hydrophobic material for an adequate amount of time. Exemplary hydrophobic monolayers include alkanethiols, comprising a hydrocarbon terminal group bound to a sulfur atom, which has an affinity for many metals including, gold, silver, platinum, and copper. Exemplary alkanethiols include, but are not limited to, octadecanethiol, hexadecanethiol, and perfluorohexadecanethiol. Other ligands are also possible. For example, a phosphate-based self-assembled monolayer may be employed. Although illustrated in a simplest self-assembled monolayer (SAM) form in FIG. 3, the hydrophobic monolayer 330 may also be cross-linked, for example through exposure to a secondary reagent, such as Hexadecane. Cross-linking may advantageously improve hydrophobicity and/or enhance robustness of the coating.

Figure 4:
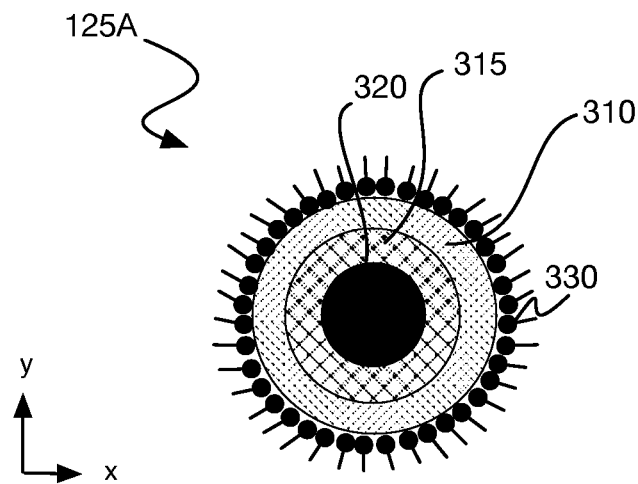
FIG. 4 is transverse sectional view of a composite probe pin, in accordance with some embodiments.

In some embodiments, pins of a probe pin array are composite metal wires that include a core metal radially encased within one or more peripheral metals. FIG. 3 includes a longitudinal sectional view of a composite probe pin 125A, and FIG. 4 provides a transverse sectional view of composite probe pin 125A, in accordance with some embodiments. As shown in FIGS. 3 and 4, composite probe pin 125A includes a core metal 320 radially encased in a peripheral metal bi-layer that includes an intermediate metal 315 separating core metal 320 from outer metal 310. Core metal 320, intermediate metal 315, and outer metal 310 may each be any known metal(s). In some advantageous embodiments, core metal 320 is a refractory metal of suitable toughness, such as, but not limited to, tungsten. In some further embodiments, intermediate metal 315 is a metal of higher conductivity than that of core metal 320, such as, but not limited to, silver. In some further embodiments, outer metal 310 is a noble metal, such as but not limited to, gold. In some composite metal probe pin embodiments, the one or more peripheral metals is recessed from the core metal at the tip of the probe pin, opposite the substrate. This recessing of the peripheral metals may ensure core metal 320 is sufficiently exposed to make direct contact with a DUT during electrical test.

In the exemplary embodiment illustrated in FIG. 3, peripheral metals 310 and 315 are both recessed by at least longitudinal recess length $L_R$. In some embodiments with more than one peripheral metal, each of the peripheral metals is recessed by substantially the same amount. For some embodiments where hydrophobic monolayer 330 is also recessed from the probe tip by at least the longitudinal recess length $L_R$, hydrophobic monolayer 330 is disposed on an outer surface of the peripheral metal (e.g., surface of outer metal 330), while it is substantially absent from a surface of core metal 320 exposed at the tip. Because hydrophobic monolayer 330 can be expected to be retained throughout the working life of a probe pin array, an analysis of the presence and/or absence of the monolayer on various features of the probe tip may reveal the process employed to recess etch one or more of the peripheral metals. For example, the absence of the hydrophobic monolayer 330 on core metal 320 is indicative of a conditioning process that exposes core metal 320 after the hydrophobic monolayer 330 was formed.

Figure 5:
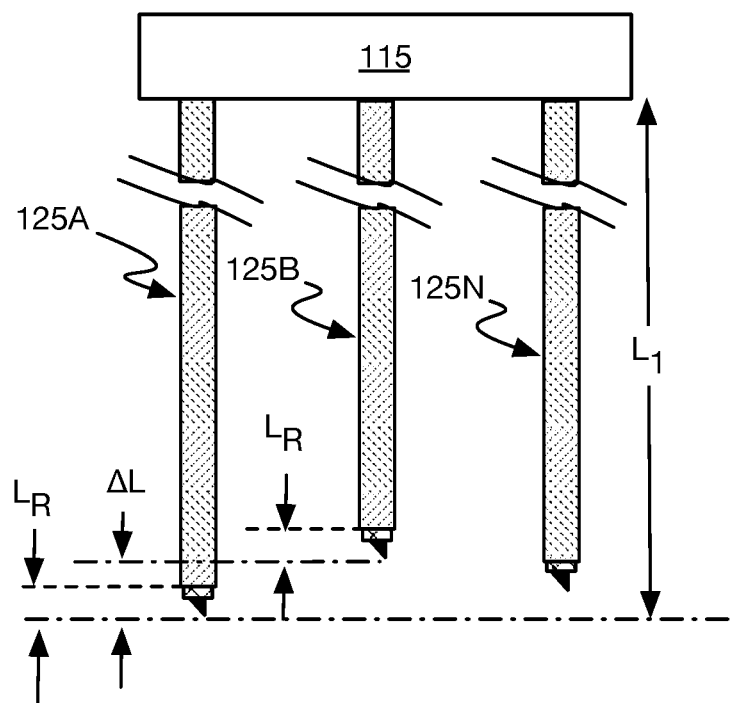
FIG. 5 is 2D side view of probe pins of a pin array, in accordance with some embodiments.

Another indication of the probe tip conditioning process is the extent of variation in the longitudinal recess length $L_R$ relative to the variation in the longitudinal lengths of the pins over the array. In accordance with some embodiments herein, the amount by which one or more peripheral metals are recessed below a core metal at the probe tip is independent of the length of the probe pin. FIG. 5 provides 2D side view of probe pins 125A, 125B, and 125N of an N-pin array, in accordance with some such embodiments. As shown, pins 125A-N, when in a relaxed state, extend from substrate 115 by the longitudinal length $L_1$, which has a range over the pin array of $\Delta L$. The longitudinal recess length $L_R$ however, varies independently of $L_1$, and indeed is advantageously associated with a recess range (e.g., $\Delta L_R$) that is significantly less than the pin length range $\Delta L$. Such an independence and/or small variation the longitudinal recess length $L_R$ would not be expected of a technique in which the probe pin array 125 was, for example, partially submerged (i.e., dipped) into an etchant bath as such a conditioning technique would tend to recess longest pins by a proportionate amount more than the shortest pins.

With various salient features of an electrical-test probe pin array presented above, a description of methods for conditioning probe pins to arrive at one or more of the above features is provided below. It is noted that one or more of the aspects of the methods described below may also be employed to provide structural features other than those described above. Likewise, it is noted that one or more of the structural features described above may also be fabricated by methods other than those outlined below.

Figure 6:
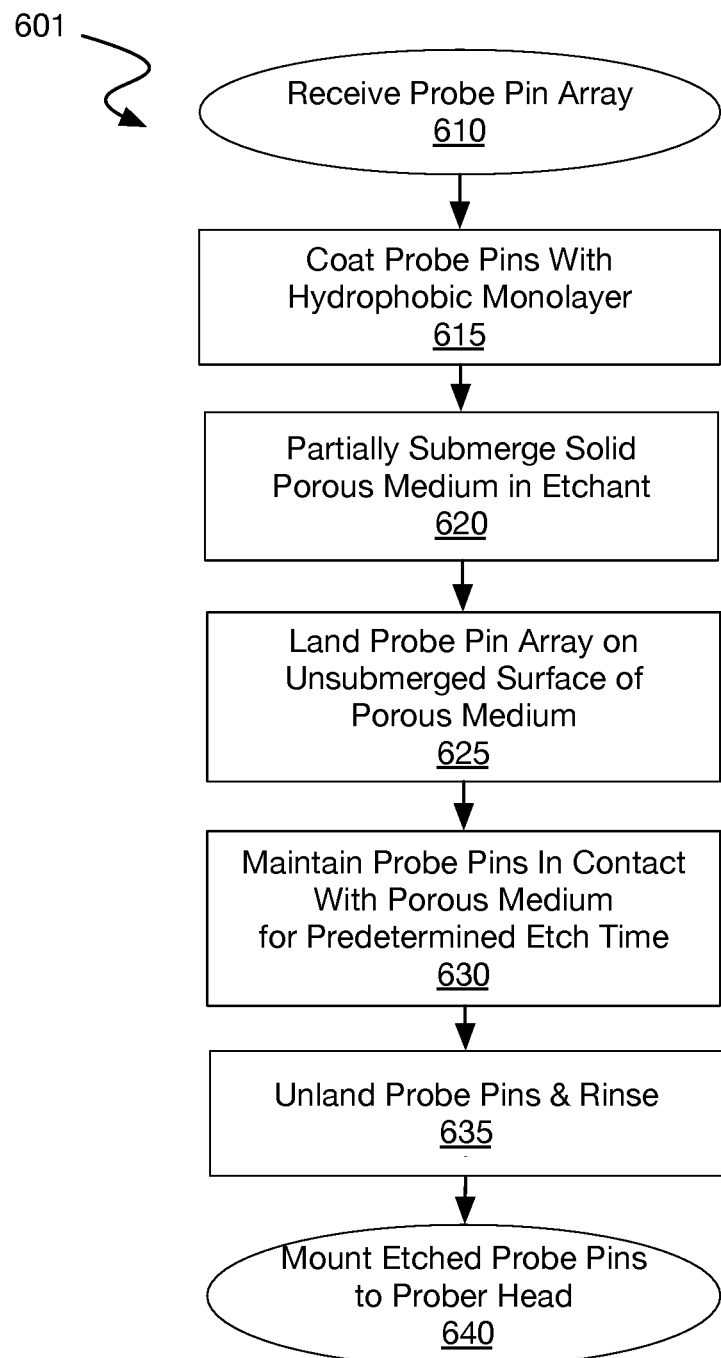
FIG. 6 is a flow diagram of a method for etching probe pins of an electrical-test probe pin array, in accordance with some embodiments.

FIG. 6 is a flow diagram of a method 601 for etching probe pins of an electrical-test probe pin array, in accordance with some embodiments. Generally, method 601 is to process the array of probe pins as a unit (i.e., each pin in the array is parallel processed). The probe pin etching may be performed for various purposes. In some exemplary embodiments, the etching is to recess one or more metals from a tip of the probe either to shape the probe tip and/or to define the probe contact surface material.

Method 601 begins with receiving a probe pin array at operation 610. In some exemplary embodiments, the probe pin array received comprises a plurality of conductive pins, each of the pins extending outwardly from a first pin end anchored to a substrate. The substrate may further include conductive traces, with each of the traces electrically coupled to one of the probe pins. The probe pin array may be dimensioned to accommodate any number of probe pins. For example, a probe pin array may extend over an area of 1 cm$^2$, or more. In some embodiments, the probe pin array spans at least 50 mm in at least one dimension of the array (e.g., x-dimension). Individual probe pin dimensions may vary, but in some exemplary embodiments a single probe pin has a diameter below 50 µm, and advantageously below 40 µm. Probe pins of such diameter may extend outwardly from the substrate by a longitudinal length $L_1$ of about 300 µm, or more. Probe pin pitch may vary, both between different probe arrays, and within a single array. In some embodiments where probe pin diameter is below 50 µm, pitch may be 120 µm, or less, in some regions of the array. As received, an end face of each probe pin may have a bias cut or be substantially cross-cut.

Method 601 continues at operation 615, where a hydrophobic monolayer is applied to an external surface of the conductive probe pins. In some exemplary embodiments where the conductive probe pins have a metallic external surface, the probe pin array is submerged in a solution of hydrophobic material for a predetermined amount to time to allow for self-assembly of the monolayer. In some embodiments, at operation 615 the probe pin array is completely submerged into a thiol solution, for example including one or more of octadecanethiol, hexadecanethiol, and perfluorohexadecanethiol. Following the timed solution exposure, the probe pin array is allowed to dry, for example by evaporation.

At operation 620 a solid porous medium is exposed to a wet chemical etchant that is to be employed in conditioning the probe pin array. The solid porous medium is to advantageously provide a land upon which the many tips of the probe pin array may contact. The medium is further to place landed probe pin tips in fluid communication with the wet chemical etchant to which the medium has been exposed, thereby defining a planar etch front relative to the probe tips. The medium is further to control conveyance of the wet chemical etchant, for example by capillarity of the porous medium, thereby exposing to the chemical etchant only the probe tip surfaces that make intimate physical contact with a wetted surface of the medium. The medium may be a unitary body of inorganic or organic composition. In some advantageous embodiments, the medium is a unitary body of a material that can be machined and/or polished to flat, has sufficient mechanical strength to deflect probe pins, and has a fluidic conductivity sufficient to convey a wet chemical etchant of given viscosity through a bulk thickness of the medium.

Figure 7A:
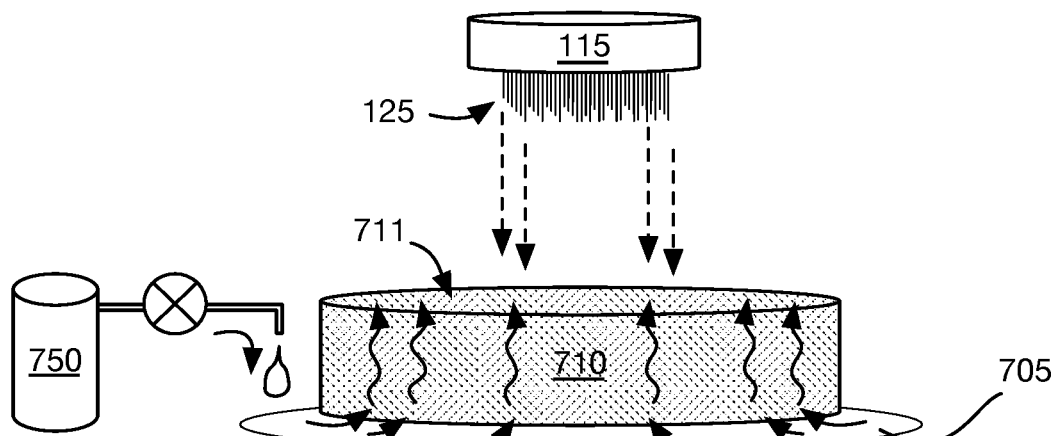
FIGS. 7A and 7B are isometric schematics depicting tip ends of a probe pin array placed in fluid communication with a liquid etchant conducted through a porous solid medium, in accordance with some embodiments.

FIG. 7A is an isometric schematic depicting a porous solid medium 710 being exposed to a wet chemical etchant 705, in accordance with some embodiments. In this example, porous solid medium 710 is a disk having a flat working surface (e.g., top surface 711) of an area at least as large as the footprint of probe pin array 125. A surface of porous solid medium 710 opposite the working surface may be exposed to the wet chemical etchant. In the example illustrated in FIG. 7A, porous solid medium 710 is partially submerged in a pool of wet chemical etchant 705, that may be further contained in a larger plenum (not depicted). The quantity of wet chemical etchant 705 may be metered from a supply vessel 750. In the example shown, fluidic conductivity of porous solid medium 710 conveys wet chemical etchant 705 through the bulk medium thickness (which may be on the order of millimeters) to wet the working surface. Alternatively, porous solid medium 710 may be provisioned as a solid membrane of a dead end filtration system in which the wet chemical etchant is supplied on a high pressure side and, as permeate flow, and contacts probe pins landed on the low pressure side of the membrane. Hence, capillary force, or another driving force (e.g., pressure, electrical potential, etc.) may be employed to convey the wet chemical etchant through the porous solid medium. A porous solid medium resistant to the chemical etchant may be selected on the basis of one or more of porosity, average pore size, and hydraulic conductivity, for example. In some exemplary embodiments, the medium is a sintered metal, a ceramic (e.g. alumina, silica, titanium oxide), or sintered glass.

An appropriate chemical etchant may be selected depending on what materials(s) are to be removed from the probe pins. Any wet chemistry known to be suitable for etching a particular material may be employed. For some exemplary embodiments where each probe pin includes a core metal radially encased in a peripheral metal, a wet chemical etchant of the one or more peripheral metal is selected. Advantageously, the wet chemical etchant is selective to the peripheral metal(s) over the core metal. In some embodiments where the core metal is refractory and the one or more peripheral metal includes a noble metal, the chemical etchant comprises one or more of potassium iodide/iodine, nitric acid, or aqua regia.

Figure 7B:
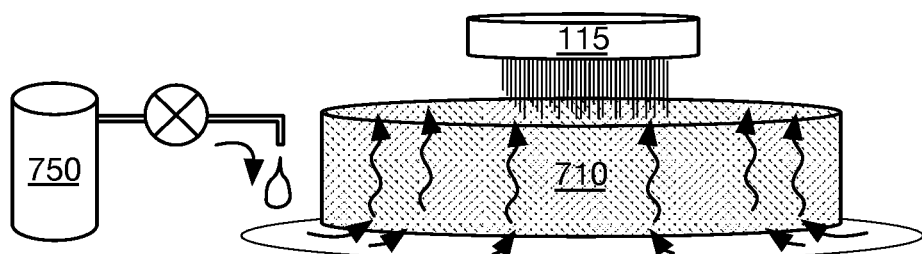

Returning to FIG. 6, method 601 continues with landing the probe pin array on a working surface of the porous medium. In exemplary embodiments, the working surface, although wetted by the chemical etchant, is not itself submerged in the chemical etchant. For example, as further illustrated in FIG. 7B, upon wetting of the porous solid medium surface 711 by capillary action, probe pin array 125 may be brought down to contact medium surface 711. In advantageous embodiments, landing the probe pin array entails overdriving the array relative to the working surface of the porous medium, inducing deflection and/or strain in one or more of the probe pins by an amount sufficient to ensure the probe pin of shortest longitudinal length makes contact with medium surface 711. For example, in further reference to FIG. 5, a probe pin array may be overdriven by ΔL upon probe pin 125A making first contact with the medium surface.

Method 601 (FIG. 6) continues at operation 630 where the probe pins are maintained in contact with the porous medium for a predetermined etch time. In exemplary embodiments, the probe pins are coated with a hydrophobic monolayer and this monolayer although dissolved along with the underlying peripheral metal(s) at the etch front, increases the contact angle of the wet chemical etchant and limits wicking of etchant over the pin surface. The etch front also advantageously proceeds with axial symmetry, for example recessing the peripheral metal(s) from the core by a greater amount over time. Hence, the etchant may be considered an etchant of both the monolayer and peripheral metal(s), recessing each by approximately the same amount to arrive at a tip portion including only the core metal.

Figure 7C:
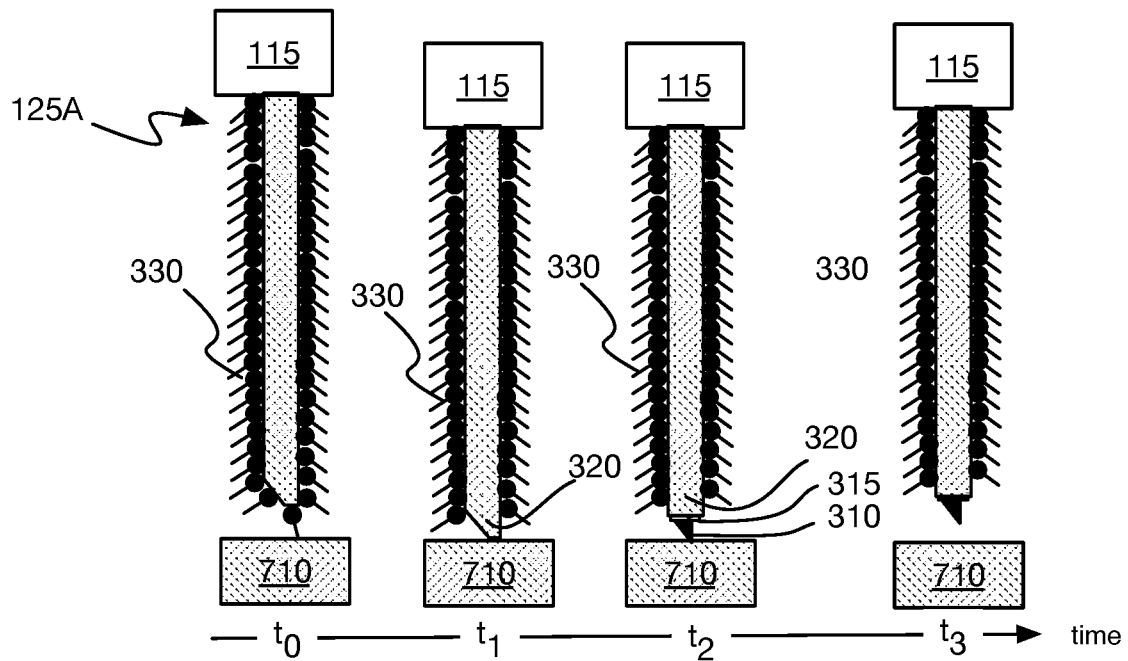
FIG. 7C illustrates a 2D side view of a probe pin contacting a porous solid medium as a function of time, in accordance with some embodiments.

FIG. 7C illustrates a 2D side view of a probe pin 125A in contact with porous solid medium 710 as a function of time, in accordance with some embodiments. As shown, at an initial time $t_0$, probe pin 125A, fully coated in hydrophobic monolayer 330A, is landed onto a wetted surface of porous medium 710. At a later time $t_1$, hydrophobic monolayer 330A has been recessed from the tip by a first longitudinal length. At a still later time $t_2$, additional time in contact with porous medium 710 has recessed outer metal 320 and intermediate metal 315 by a longitudinal recess length to expose core metal 310 at the probe pin tip. Subsequently, at time $t_3$, the probe pin array is removed from contact with porous medium, and/or rinsed, to terminate the chemical etching at operation 635 (FIG. 6). The probe pin array is then substantially ready for mounting to a prober head and placed into electrical test service at operation 640 following any known techniques.

It is noted that a relatively low flux of wet chemical etchant at the wetted solid surface of the porous medium may permit accumulation of etch byproducts on the porous medium working surface over time. To avoid quenching the etch process, periodic cleans of the porous medium, and/or repositioning of the probe pin array on the porous medium may facilitate higher etch rates and/or greater total recess depths.

It is also noted that one or more of the operations described above in the context of method 601 may be optional and therefore eliminated while still achieving advantages through the practice of the remaining operations. For example, probe pins that have not been coated with a hydrophobic monolayer and/or have been coated with a material offering an alternative functionality may nevertheless be processed with a wet chemistry conveyed through a solid porous medium. As another example, probe pins that have been coated with a hydrophobic monolayer may be alternatively processed with a wet chemistry delivered by other than a solid porous medium.

It is further noted that although described in the context of an electrical-test probe pin array, the method of conveying a wet chemical agent to a nano-scaled structure as set forth above has broad applicability beyond electrical-test probe pin arrays, and indeed beyond wet chemical etching. For example, any array of sample structures having nano-scale dimensions similar to those of the probe pin embodiments described herein may be processed with any wet chemical agent conveyed through a solid porous medium. For example, a material conveyed through the solid porous medium might be selectively deposited to a tip portion of the sample structures that directly contact the porous medium. Hence, both location-specific wet chemical material removal and deposition may be premised on delivery of a reagent through a solid porous medium following the techniques described herein.

While certain features set forth above have been described with reference to various implementations, this description is not intended to be construed in a limiting sense. Thus, various modifications of the implementations described herein, as well as other implementations, which are apparent to persons skilled in the art that the present disclosure pertains, are deemed to lie within the spirit and scope of the present disclosure.

It will be recognized that the disclosure is not limited to the embodiments so described, but can be practiced with modification and alteration without departing from the scope of the appended claims. For example the above embodiments may include specific combinations of features as further provided below.

In one or more first embodiments, an electrical-test prober head, comprises a substrate including a plurality of conductive traces, each of the traces to electrically couple with an electrical testing apparatus, and an array of conductive pins, each of the pins extending outwardly from a first pin end anchored to the substrate and electrically coupled to at least one of the conductive traces, wherein at least a partial length of each of the pins is coated with a hydrophobic monolayer.

In furtherance of the first embodiments, the hydrophobic monolayer comprises a thiol.

In furtherance of the first embodiments, each of the pins comprises a composite metal wire further including a core metal encased within one or more peripheral metals, and each of the pins has a tip opposite the first pin end, the one or more peripheral metals recessed from the core metal at the tip.

In furtherance of the first embodiments immediately above, the hydrophobic monolayer is disposed on an outer surface of the peripheral metal, and is absent from a surface of the core metal exposed at the tip.

In furtherance of the first embodiments, the one or more peripheral metal comprises a bi-layer disposed over the core metal, and each layer of the bi-layer is recessed from the core metal.

In furtherance of the first embodiments, the pins extend from the substrate by a longitudinal length, and the amount by which the one or more peripheral metals are recessed below the core metal at the tip is independent of the longitudinal pin length.

In furtherance of the first embodiments immediately above, the longitudinal pin length varies over a range and the amount by which the one or more peripheral metal is recessed varies by less than the range.

In furtherance of the first embodiments, the pin array has minimum diameter less than 50 μm and a pitch less than 120 μm, and the peripheral metal is recessed from the core metal by at least 50 μm.

In one or more second embodiments, a method of conditioning tips an electrical-test probe pin array, the method comprises contacting a tip end of the pins of the array on a solid porous medium, placing the tip end of the pins in fluid communication with a liquid etchant by exposing the medium to the etchant while the pins are contacting the medium, and removing the pins from contact with the medium after the etchant has etched a portion of the pins.

In furtherance of the second embodiments, the method further includes coating an exterior metallic surface of the pins with a hydrophobic monolayer.

In furtherance of the second embodiments immediately above, coating the exterior metallic surface comprises exposing the metallic surface to a thiol.

In furtherance of the second embodiments, the porous medium comprises a porous substrate having pores sufficient to convey the etchant by capillary action through an entire thickness of the substrate.

In furtherance of the second embodiments, the porous medium comprises a porous substrate selected from the group consisting of aluminum oxide, titanium oxide, silicon oxide, and sintered glass.

In furtherance of the second embodiments, contacting the tip end of the pins further comprises over-driving the pin array to deflect a longest of the pins sufficiently to contact the medium with a shortest of the pins.

In furtherance of the second embodiments, contacting the tip end of the pins on the porous medium further comprises contacting a top surface of the porous medium with each of the pins, and exposing the medium to the etchant further comprises placing a bottom surface of the porous medium, opposite the top surface, in the etchant.

In furtherance of the second embodiments immediately above, the etchant is selected from the group consisting of potassium iodide and iodine, nitric acid, and aqua regia.

In furtherance of the second embodiments, placing the bottom surface of the porous medium in the etchant further comprises partially submerging the porous medium in a pool of the etchant.

In furtherance of the second embodiments immediately above, the pool of etchant has an area at least equal to that of the bottom surface, and the top surface of the medium is unsubmerged in the etchant.

In one or more third embodiments, a method of testing a singulated unpackaged die comprises aligning the die to an array of conductive pins disposed on a prober space transformer, the pins extending outwardly from first pin ends electrically coupled to conductive traces disposed on a space transformer substrate. The method comprises contacting a top metallization level of the die with second pin ends of the conductive pin array, executing an electrical test algorithm on the die through the array of conductive pins, wherein at least a partial length of each of the pins is coated with a hydrophobic monolayer.

In furtherance of the third embodiments, each of the pins comprises a composite metal wire further including a core metal encased within one or more peripheral metal, and the one or more peripheral metal is recessed from the core metal at the second pin ends.

In furtherance of the third embodiments immediately above, the one or more peripheral metal comprises a bi-layer disposed over the core metal, each layer of the bi-layer is recessed from the core metal at the second pin ends, and the hydrophobic monolayer is disposed on an outer surface of the peripheral metal, and is absent from a surface of the core metal exposed at the second pin ends.

In one or more fourth embodiments, a method of processing one or more nano-scale structural members comprises contacting a first end of the structural members to a first surface of a porous solid medium, wet chemical processing the first end of the structural members with a fluidic chemical agent conveyed through the medium upon exposure of a second surface of the medium to the fluidic chemical agent, and removing the structural members from contact with the medium after the processing has completed.

In furtherance of the fourth embodiments, the wet chemical processing comprises at least one of material deposition upon, or removal from, the structural members, and the fluid chemical agent is conveyed through the medium by at least one of capillary action or a pressure differential between the first and second surfaces.

In furtherance of the fourth embodiments, the solid medium comprises at least one of a porous ceramic, sintered metal, or sintered glass, and the fluid chemical agent comprises an aqueous solution.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

We claim:

1. An electrical-test prober head, comprising:
a substrate including a plurality of conductive traces, each of the traces to electrically couple with an electrical testing apparatus; and
an array of conductive pins, wherein individual ones of the pins:
extend from a pin end anchored to the substrate by a longitudinal pin length, and are electrically coupled to at least one of the conductive traces;
comprise a composite metal wire further including a core metal clad within a peripheral metal; and
have a tip opposite the anchored pin end, the peripheral metal absent from the core metal over a longitudinal recess length of the tip;
wherein the longitudinal pin length varies across the array by a first amount, and the longitudinal recess length varies across the array by a second amount, less than the first amount; and
wherein at least a partial length of each of the pins between the tip and the anchored pin end is coated with a hydrophobic material on an outer surface of the peripheral metal, the hydrophobic material absent from a surface of the core metal exposed within the longitudinal recess length.

2. The prober head of claim 1, wherein the longitudinal pin length varies over a first range and the longitudinal recess length varies by a second range less than the first range.

3. The prober head of claim 2, wherein the longitudinal pin length is at least 300 µm, and the longitudinal recess length is at least 50 µm.

4. The prober head of claim 3, pin array has a minimum pin diameter less than 50 µm and a pin pitch less than 120 µm.

5. The prober head of claim 1, wherein the longitudinal recess length is independent of the longitudinal pin length.

6. The prober head of claim 1, wherein the hydrophobic material is on the outer surface of the peripheral metal at an intersection of the anchored pin end and the substrate.

7. The prober head of claim 1, wherein the hydrophobic material comprises a thiol.

8. The prober head of claim 7, wherein the thiol is a monolayer.

9. The prober head of claim 7, wherein the thiol comprises at least one of octadecanethiol, hexadecanethiol, and perfluorohexadecanethiol.

10. The prober head of claim 1, wherein the core metal is a refractory metal and the peripheral metal has higher conductivity than the core metal.

11. The prober head of claim 10, wherein the core metal comprises W, and the peripheral metal comprises a noble metal.

12. The prober head of claim 11, wherein the peripheral metal comprises Au.

13. The prober head of claim 1, wherein:
the peripheral metal comprises a bi-layer over the core metal; and
each layer of the bi-layer is recessed from the core metal.

14. An electrical test apparatus, comprising:
the prober head of claim 1;
an electrical tester to perform a functional, performance, or stress test of a device under test (DUT) coupled to the tester through the probe head; and
a carrier to support the DUT during an execution of the functional, performance, or stress test.

15. The electrical test apparatus of claim 14, wherein the DUT is an integrated circuit die.

16. A method of preparing tips of an electrical-test probe pin array, the method comprising:
placing a tip end of individual pins of the array in fluid communication with a liquid etchant contained within a solid porous medium by contacting the tip end to a surface of the medium; and
removing the pins from contact with the medium after the etchant has etched a portion of the pins.

17. The method of claim 16, wherein the porous medium comprises aluminum oxide, titanium oxide, silicon oxide, or sintered glass.

18. The method of claim 16, wherein contacting the tip end of the pins further comprises over-driving the pin array to deflect a longest of the pins sufficiently to contact the medium with a shortest of the pins.

* * * * *